United States Patent
Rhie

Patent Number: 5,850,161
Date of Patent: Dec. 15, 1998

[54] DIGITAL FM DEMODULATOR USING PULSE GENERATORS

[75] Inventor: Han-seung Rhie, Seoul, Rep. of Korea

[73] Assignee: Samsung Electronics, Co., Ltd., Suwon, Rep. of Korea

[21] Appl. No.: 773,792

[22] Filed: Dec. 24, 1996

[30] Foreign Application Priority Data

Dec. 30, 1995 [KR] Rep. of Korea ........................ 95-69710

[51] Int. Cl.$^6$ ....................................................... H03D 3/02
[52] U.S. Cl. ........................... 329/336; 329/343; 455/214; 455/337
[58] Field of Search ..................................... 329/327, 336, 329/341, 342, 343, 323; 455/214, 337

[56] References Cited

U.S. PATENT DOCUMENTS

| | | | |
|---|---|---|---|
| 3,244,991 | 4/1966 | Hofmann | 329/327 |
| 4,504,792 | 3/1985 | Furihata | 329/327 |
| 4,614,912 | 9/1986 | Moberg | 329/327 |
| 4,800,338 | 1/1989 | Yoshizawa et al. | 329/342 |
| 4,839,606 | 6/1989 | Hallock | 329/341 |

*Primary Examiner*—Siegfried H. Grimm
*Attorney, Agent, or Firm*—Mager, Johnson, McCollom, & Stolowitz P.C.

[57] ABSTRACT

A frequency modulation (FM) signal demodulating circuit having a simple structure using general digital devices is provided. The FM signal demodulating circuit according to the present invention includes a first pulse generator for generating a pulse signal having a predetermined pulse width at every rising edge of the input FM signal, a second pulse generator for generating a pulse signal having a predetermined pulse width at every falling edge of the input FM signal, a combining portion for combining the pulse signals generated in the first pulse generator and the second pulse generator, and a low-pass filter for performing a low-pass filtering operation by receiving a combined pulse signal generated in the combining portion and outputting a signal having a magnitude corresponding to the frequency of the input FM signal.

The FM signal demodulating circuit according to the present invention has a simple structure.

4 Claims, 3 Drawing Sheets

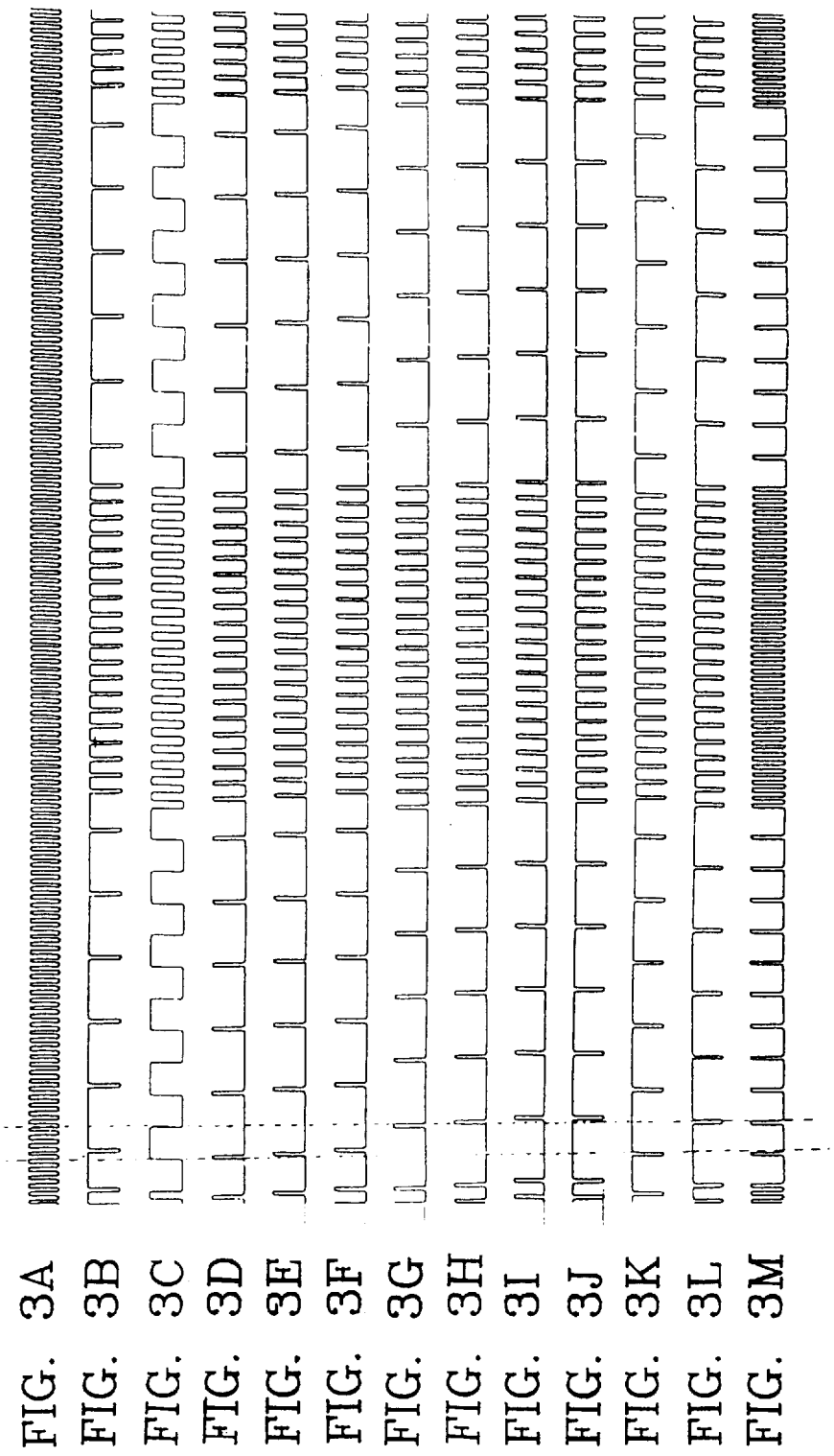

DIGITAL FM DEMODULATOR USING PULSE GENERATORS

BACKGROUND OF THE INVENTION

The present invention relates to a frequency modulation (FM) signal demodulating circuit.

Various methods for demodulating an FM signal have been provided for in conventional devices. One representative method is quadrature demodulation by a phase shift using a coil. Another method is phase locked loop (PLL) demodulation using a PLL circuit.

An external coil can be used in the quadrature demodulation method, however the use of an external component adds to the cost and complexity of the circuit. A frequency discriminator may be used instead of the external coil, but this also introduces higher costs.

The PLL demodulation method has the disadvantage of being a complicated circuit.

SUMMARY OF THE INVENTION

To solve the problems discussed above, it is an object of the present invention to provide an FM signal demodulating circuit having a simple structure using standard digital devices.

To achieve the above object, there is provided an FM demodulating circuit according to the present invention, comprising a first pulse generator for generating a pulse signal having a predetermined pulse width at every rising edge of the input FM signal, a second pulse generator for generating a pulse signal having a predetermined pulse width at every falling edge of the input FM signal, combined logic for combining the pulse signals generated in the first pulse generator and the second pulse generator, and a low-pass filter for performing a low-pass filtering operation upon a combined pulse signal received from the combining portion and outputting a demodulated signal having a magnitude that varies in accordance with the frequency of the input FM signal.

BRIEF DESCRIPTION OF THE DRAWINGS

These and other features of the present invention will become more apparent by describing in detail a preferred embodiment thereof with reference to the attached drawings in which:

FIGS. 3A–3M are waveform diagrams showing the operation of the elements shown in FIG. 2.

DETAILED DESCRIPTION OF THE INVENTION

The present invention is directed toward an FM demodulation circuit having a simple design which may be constructed from standard digital devices.

Figure 1:
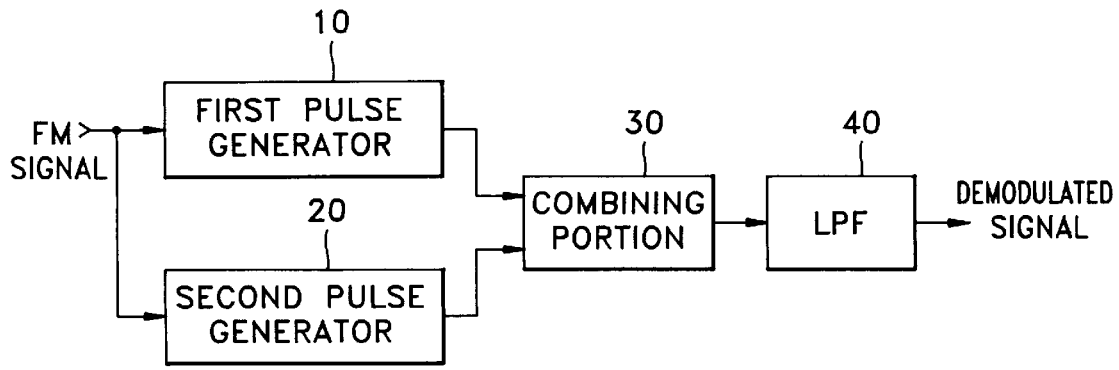
FIG. 1 is a simplified block diagram showing the structure of an FM signal demodulating circuit according to the present invention.

FIG. 1 is a simplified block diagram showing the structure of an FM signal demodulating circuit according to the present invention. The apparatus shown in FIG. 1 includes a first pulse generator 10, a second pulse generator 20, combinational logic 30, and a low pass filter (LPF) 40.

In the first pulse generator 10, at every rising edge of the FM signal, a first pulse signal having a predetermined pulse width is generated. Here, the pulse width of the first pulse signal is preferably smaller than the shortest period of the FM signal.

The second pulse generator 20 generates a second pulse signal having a predetermined pulse width at every falling edge of the FM signal. Here, the pulse width of the second pulse signal is preferably smaller than the shortest period of the FM signal.

The combinational logic 30 receives the first pulse signal and the second pulse signal and generates a pulse train in which the first pulse signal and the second pulse signal are combined.

The low pass filter 40 performs low-pass filtering from the output of the combinational logic 30 and outputs a low-pass filtered signal. Here, the magnitude of the demodulated signal output from the low pass filter 40 corresponds to the frequency of the input FM signal.

Figure 2:
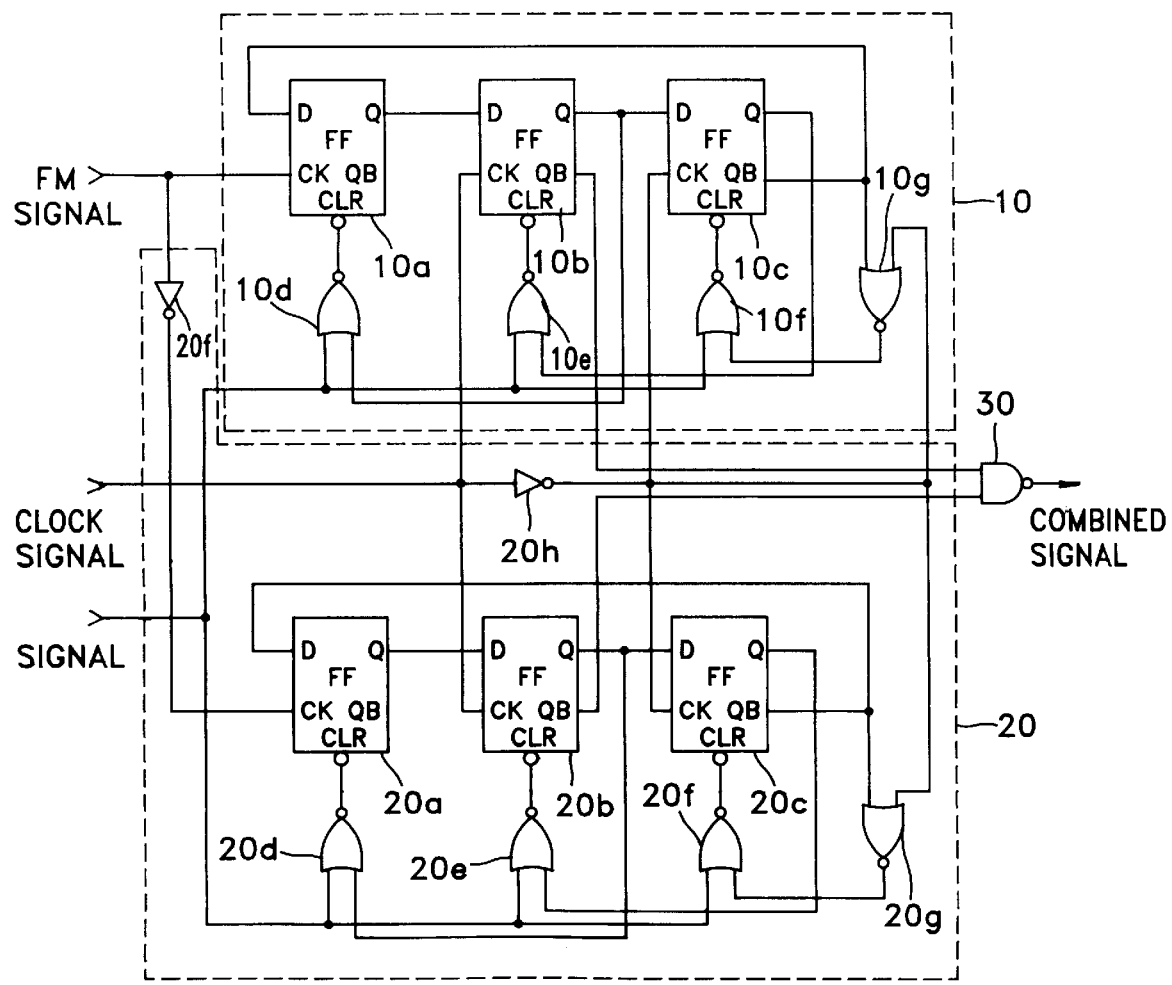
FIG. 2 is a detailed logic diagram illustrating the first pulse generator, the second generator, and the combinational logic shown in FIG. 1.

FIG. 2 is a detailed block diagram schematically illustrating the first pulse generator 10, the second pulse generator 20, and the combinational logic 30 shown in FIG. 1.

The first pulse generator 10 includes a first D flip-flop 10a which receives the input FM signal at its clock input terminal and generates a positive output at every rising edge of the FM signal, a second D flip-flop 10b which receives the positive output from the first flip-flop 10a at its D input and provides its positive output as a clear input to the first D flip-flop 10a, and a third D flip-flop 10c which receives the positive output of the second D flip-flop 10b as its D input and providing its positive output as a clear input of the second D flip-flop 10b.

The second D flip-flop 10b and the third D flip-flop 10c operate in response to a clock signal.

The second generator 20 includes a fourth D flip-flop 20a which receives the inverted signal of the input FM signal in its clock input terminal and generates a positive output at every falling edge of the FM signal, a fifth D flip-flop 20b which receives the positive output of the fourth flip-flop 20a as its D input and provides its positive output as a clear input to the fourth D flip-flop 20a, and a sixth D flip-flop 20c which receives the positive output of the fifth D flip-flop 20b as its D input and provides its positive output as a clear input to the fifth D flip-flop 20b.

The fifth D flip-flop 20b and the sixth D flip-flop 20c operate in response to the inverted clock signal.

The combinational logic 30 performs a NAND operation on the negative outputs QB of the second D flip-flop 10b and the fifth D flip-flop 20b to produce a combined signal output.

The operation of the FM signal demodulating circuit of FIGS. 1 and 2 will now be described in greater detail. The first D flip-flop 10a of the first pulse generator 10 receives an FM signal as the clock input and generates a positive output at each rising edge of the FM signal.

The second D flip-flop 10b and the third D flip-flop 10c each delay the output signal of the first D flip-flop 10a by one clock signal period. At the same time, the outputs of the second D flip-flop 10b and the third D flip-flop 10c are provided as the clear input to their respective preceding stage flip-flop by being NOR-ed with a reset signal through a first NOR gate 10d and a second NOR gate 10e respectively. Also, the third D flip-flop 10c provides its negative output to the D input of the first D flip-flop 10a and to its own clear input through a third NOR gate 10f and a fourth NOR gate 10g.

Therefore, the first pulse generator 10 generates the first pulse signal at every rising edge of the FM signal. The width of the pulses in this first pulse signal are determined by the period of the clock signal applied to the second D flip-flop 10b and the third D flip-flop 10c.

The operation of the second pulse generator 20 is the same as that of the first pulse generator 10 except that the second pulse signal is generated at the falling edge of the FM signal because the input FM signal is inverted by inverter 20f and then input to the clock terminal of the fourth D flip-flop 20a.

The combinational logic 30 receives the first pulse signal generated at the QB output of the second D flip-flop 10b of the first pulse generator 10 and the second pulse signal generated in the fifth D flip-flop 20b of the second pulse generator 20 and performs a NAND operation to produce a combined signal. As a result, this combined signal consists of a pulse train having a frequency that is twice that of the FM signal.

The low pass filter 40 performs low-pass filtering of the output of the combinational logic 30 and generates a demodulated signal. The voltage magnitude of the demodulated signal corresponds to the frequency of the FM signal.

Figure 4A:
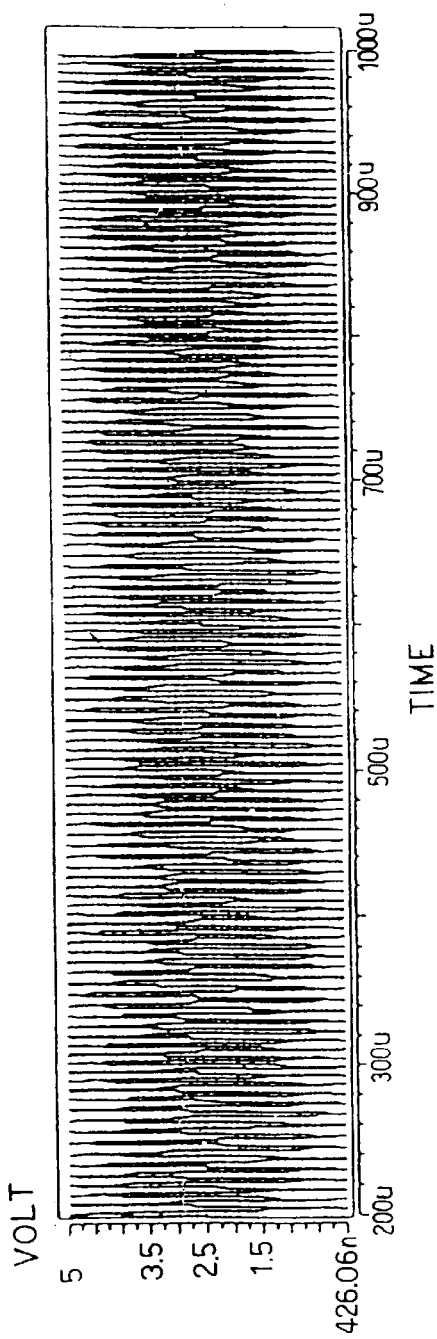
FIG. 4A is a waveform diagram of an example of the FM signal input to the present invention.
Figure 4B:
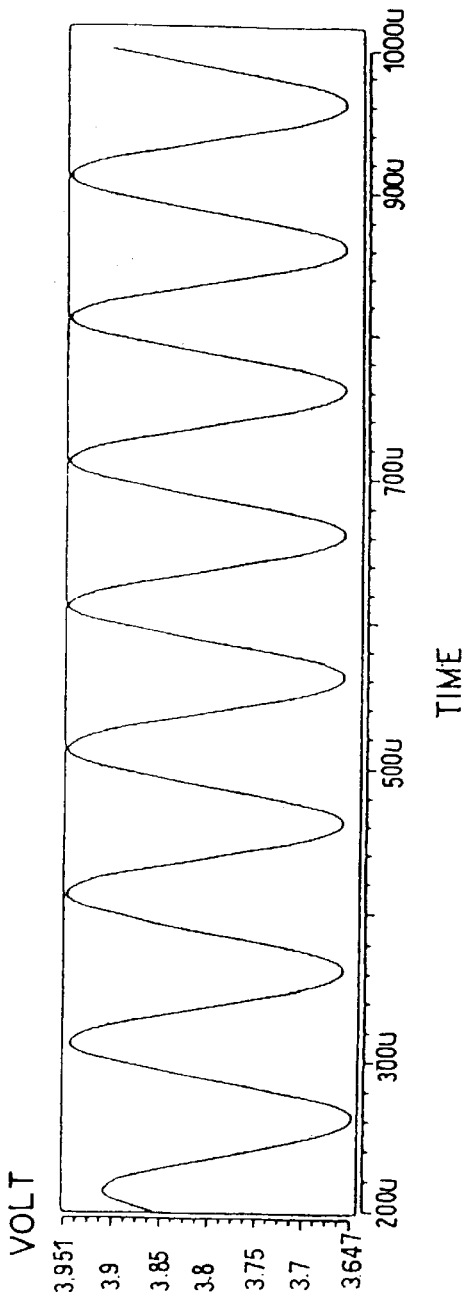
FIG. 4B is a waveform diagram of an example of the demodulated signal produced by the present invention.

FIG. 3 is a waveform diagram showing the operation of the apparatus shown in FIG. 2. Here, FIGS. 3A, 3B, 3C, 3D, 3E, and 3F show the waveform of the clock signal, the negative output of the third D flip-flop 10c, the waveform of the input FM signal, the positive output of the first D flip-flop 10a, the positive output of the second D flip-flop 10b, and the positive output of the third D flip-flop 10c, respectively. FIGS. 3G, 3H, and 3I show the positive output of the fourth D flip-flop 20a, the positive output of the fifth D flip-flop 20b, and the positive output of the sixth D flip-flop 20c, respectively. FIGS. 3J, 3K, 3L, and 3M show the negative output of the sixth D flip-flop 20c, the negative output of the second D flip-flop 10b, the negative output of the fifth flip-flop 20b, and the output of the combinational logic 30, respectively. FIGS. 4A and 4B are waveform diagrams showing the operation of the low-pass filter shown in FIG. 1. FIG. 4A shows a waveform of the FM signal which is input to the FM signal demodulating circuit of the present invention. FIG. 4B shows the waveform of the demodulated signal. The FM signal in FIG. 4A is demodulated in the present invention to produce the demodulated output signal of FIG. 4B. As the FM signal increases in frequency, the number of rising and falling edges reflected in the first and second pulse signals increases correspondingly resulting in a rise in the DC level of the demodulated signal. Similarly, when the frequency of the FM signal decreases, the number of rising and falling edges decreases correspondingly and the voltage level of the demodulated signal falls.

The FM signal demodulating circuit of the present invention produces a demodulated output signal that corresponds to the input FM signal without using an external coil or a frequency discriminator and is a simple circuit constructed from standard digital devices operating with only a clock signal.

What is claimed is:

1. An FM demodulation circuit comprising:
    a pulse circuit configured to receive an input FM signal and a clock signal, wherein the pulse circuit is further configured to produce a pulse output signal having a pulse of a predetermined pulse width responsive to each edge in the input FM signal, and further wherein each pulse in the pulse output signal is synchronized with the clock signal, and still further wherein each pulse in the pulse output signal has a predetermined pulse width; and
    a low pass filter configured to receive the pulse output signal, wherein the low pass filter is further configured to produce a demodulated output signal by low pass filtering the pulse output signal such that a magnitude of the demodulated output signal corresponds to a frequency of the input FM signal;
    wherein the pulse circuit further comprises:
        a first pulse generator circuit configured to receive the input FM signal and the clock signal, wherein the first pulse generator is further configured to produce a pulse in a first pulse signal responsive to each rising edge in the input FM signal, and further wherein the pulse in the first pulse signal is synchronized with the clock signal, and still further wherein the pulse in the first pulse signal has the predetermined pulse width;
        a second pulse generator circuit configured to receive the input FM signal and the clock signal, wherein the second pulse generator is further configured to produce a pulse in a second pulse signal responsive to each falling edge in the input FM signal, and further wherein the pulse in the second pulse signal is synchronized with the clock signal, and still further wherein the pulse in the second pulse signal has the predetermined pulse width; and
        combinational logic configured to receive the first and second pulse signals, wherein the combinational logic combines the first and second pulse signals to produce the pulse output signal.

2. The FM demodulation circuit of claim 1 wherein:
    the first pulse generator circuit further comprises,
        a first flip-flop having input, output, clock and clear terminals, wherein the clock terminal of the first flip-flop is configured to receive the input FM signal;
        a second flip-flop having input, output, inverted output, clock and clear terminals, wherein the input terminal of the second flip-flop is coupled to the output terminal of the first flip-flop, the clock terminal of the second flip-flop is configured to receive the clock signal, the output terminal of the second flip-flop is coupled to the clear terminal of the first flip-flop, and the first pulse signal is generated at the inverted output of the second flip-flop responsive to the input FM signal and the clock signal;
        a third flip-flop having input, output, inverted output, clock and clear terminals, wherein the clock terminal is configured to receive the clock signal, the input terminal of the third flip-flop is coupled to the output terminal of the second flip-flop, the output terminal of the third flip-flop is coupled to the clear terminal of the second flip-flop, and the inverted output terminal of the third flip-flop is coupled to the clear terminal of the third flip-flop and to the input terminal of the first flip-flop; and
    the second pulse generator circuit further comprises,
        a first inverter having input and output terminals, wherein the input terminal is configured to receive the input FM signal;
        a fourth flip-flop having input, output, clock and clear terminals, wherein the clock terminal of the fourth flip-flop is coupled to the output terminal of the first inverter;
        a fifth flip-flop having input, output, inverted output, clock and clear terminals, wherein the input terminal of the fifth flip-flop is coupled to the output terminal of the fourth flip-flop, the clock terminal of the fifth flip-flop is configured to receive the clock signal, the output terminal of the fifth flip-flop is coupled to the clear terminal of the fourth flip-flop, and the second pulse signal is generated at the inverted output of the fifth flip-flop responsive to the input FM signal and the clock signal;

a sixth flip-flop having input, output, inverted output, clock and clear terminals, wherein the clock terminal is configured to receive the clock signal, the input terminal of the sixth flip-flop is coupled to the output terminal of the fifth flip-flop, the output terminal of the sixth flip-flop is coupled to the clear terminal of the fifth flip-flop, and the inverted output terminal of the sixth flip-flop is coupled to the clear terminal of the sixth flip-flop and to the input terminal of the fourth flip-flop.

3. The demodulation circuit of claim 2, further comprising:

a second inverter having input and output terminals, wherein the input terminal is configured to receive the clock signal, and further wherein the output terminal is coupled to the clock terminal of the third flip-flop and the clock terminal of the sixth flip-flop;

a first NOR gate having first and second input terminals and an output terminal, wherein the first input terminal of the first NOR gate is coupled to the inverting output terminal of the third flip-flop, and further wherein the second input terminal is coupled to the output terminal of the second inverter, and still further wherein the output of the first NOR gate is coupled to the clear terminal of the third flip-flop;

a second NOR gate having first and second input terminals and an output terminal, wherein the first input of the second NOR gate is coupled to the inverting output terminal of the sixth flip-flop, and wherein the second input of the second NOR gate is coupled to the output terminal of the second inverter; and wherein the combinational logic further comprises a NAND gate having a first input terminal coupled to the inverting output terminal of the second flip-flop, a second input terminal coupled to the inverting output terminal of the fifth flip-flop and an output terminal, wherein the pulse output signal is produced at the output terminal of the NAND gate.

4. A method for demodulating an input FM signal comprising the steps:

generating a pulse in a pulse output signal responsive to an edge of the input FM signal such that a frequency of pulses in the pulse output signal corresponds to a frequency of the input FM signal; and low pass filtering the pulse output signal to generate a demodulated signal having a magnitude corresponding to the frequency of the input FM signal;

wherein the step of generating a pulse in a pulse output signal further comprises:

generating a pulse in a first pulse signal responsive to a rising edge of the input FM signal, generating a pulse in a second pulse signal corresponding to a falling edge of the input FM signal, and combining the first and second pulse signals to form the pulse output signal; and wherein the step of generating a pulse in a first pulse signal further comprises clocking a first flip-flop with the input FM signal, latching an output of the first flip-flop in a second flip-flop clocked by a clock signal, clearing the first flip-flop with an output of the second flip-flop, latching an output of the second flip-flop in a third flip-flop clocked by an inverted clock signal, clearing the second flip-flop with an output of the third flip-flop, feeding back an inverted output of the third flip-flop to an input of the first flip-flop, and clearing the third flip-flop when an inverted output of the third flip-flop and the inverted clock signal are both logic low; and wherein the step of generating a pulse in a second pulse signal further comprises inverting the input FM signal, clocking a fourth flip-flop with the inverted input FM signal, latching an output of the fourth flip-flop in a fifth flip-flop clocked by the clock signal, clearing the fourth flip-flop with an output of the fifth flip-flop, latching an output of the fifth flip-flop in a sixth flip-flop clocked by an inverted clock signal, clearing the fifth flip-flop with an output of the sixth flip-flop, feeding back an inverted output of the sixth flip-flop to an input of the fourth flip-flop, and clearing the sixth flip-flop when an inverted output of the sixth flip-flop and the inverted clock signal are both logic low; and wherein the step of combining the first and second pulse signals to form the pulse output signal further comprises performing a NAND function on an inverted output of the second flip-flop and an inverted output of the fifth flip-flop to produce the pulse output signal.

* * * * *